(12) United States Patent
Seo et al.

(10) Patent No.: US 8,711,610 B2
(45) Date of Patent: Apr. 29, 2014

(54) NON-VOLATILE MEMORY ARRAY AND DEVICE USING ERASE MARKERS

(75) Inventors: Hui-Kwon Seo, Hwaseong-si (KR); Yeong-Taek Lee, Seoul (KR); Yong-Shik Shin, Hwaseong (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 320 days.

(21) Appl. No.: 13/289,277

(22) Filed: Nov. 4, 2011

(65) Prior Publication Data

US 2012/0113710 A1     May 10, 2012

(30) Foreign Application Priority Data

Nov. 8, 2010 (KR) .................. 10-2010-0110301

(51) Int. Cl.
    *G11C 11/00*      (2006.01)

(52) U.S. Cl.
     USPC ............... 365/163; 365/148; 365/185.29

(58) Field of Classification Search
     CPC ... G11C 7/1015; G11C 7/1045; G11C 11/409

USPC .................... 365/163, 148, 185.29
See application file for complete search history.

(56) References Cited

U.S. PATENT DOCUMENTS

| | | | |
|---|---|---|---|
| 4,228,524 A | 10/1980 | Neale et al. | |
| 7,864,579 B2 * | 1/2011 | Gutsche et al. | 365/185.09 |
| 7,903,457 B2 * | 3/2011 | Lung | 365/163 |
| 7,907,441 B2 * | 3/2011 | Moon et al. | 365/163 |

FOREIGN PATENT DOCUMENTS

| | | |
|---|---|---|
| KR | 100196489 | 2/1999 |
| KR | 1020050017352 A | 2/2005 |
| KR | 1020090070841 A | 7/2009 |

\* cited by examiner

*Primary Examiner* — Son Dinh
*Assistant Examiner* — Nam Nguyen
(74) *Attorney, Agent, or Firm* — Volentine & Whitt, PLLC (57) ABSTRACT

A non-volatile memory device, non-volatile memory cell array and related method of operation are disclosed. The non-volatile memory cell array includes a defined data unit stored in a plurality of non-volatile memory cells capable of being electrically overwritten within the non-volatile memory cell array, and an erase marker corresponding to the data unit and indicating whether the data unit is in an erased state or a not-erased state.

19 Claims, 6 Drawing Sheets

NON-VOLATILE MEMORY ARRAY AND DEVICE USING ERASE MARKERS

CROSS-REFERENCE TO RELATED APPLICATION

This application claims priority under 35 U.S.C. 119 to Korean Patent Application No. 10-2010-0110301 filed on Nov. 8, 2010, the subject matter of which is hereby incorporated by reference.

BACKGROUND OF THE INVENTION

The present inventive concept relates to a non-volatile memory devices including an array of non-volatile memory cells. More particularly, the inventive concept relates to non-volatile memory cell arrays having erase markers and methods of operating same.

Semiconductor memory devices may be classified as volatile and non-volatile in their operating characteristics. Volatile memory devices are generally able to perform read/write operations quickly, but lose stored data in the absence of applied power. On the other hand, non-volatile memory devices are able to retain stored data in the absence of applied power. Current examples of the non-volatile memory devices include the mask read-only memory (MROM), programmable read-only memory (PROM), erasable programmable read-only memory (EPROM), electrically erasable programmable read-only memory (EEPROM), etc.

Extensive ongoing research is focused on emerging non-volatile memory devices that are capable of storing data using material exhibiting variable resistance. Examples of memory devices using variable resistance include the phase change random access memory (PRAM), resistive random access memory (RRAM), magnetic random access memory (MRAM), etc.

Certain volatile memory devices like the dynamic RAM (DRAM) as well as certain non-volatile memory devices like flash EEPROM store data in relation to an amount of electrical charge accumulated within the constituent memory cells (i.e., in relation to a number of "charge states"). In contrast, semiconductor memory devices using a variable resistance material store data in relation to a level of resistance exhibited by the constituent memory cells (i.e., in relation to a number of "resistance states"). The PRAM stores data in relation to a number of material state for a chalcogenide alloy, the RRAM stores data in relation to the resistance exhibited by a variable resistance material, the MRAM stores data in relation to the resistance exhibited by a magnetic tunnel junction (MTJ) thin film as defined by a magnetization state of a ferromagnetic substance.

Many newer non-volatile memory device technologies, like the PRAM, RRAM and MRAM, offer promising performance advantages and system utilities over older non-volatile memory devices. Yet, multiple challenges are presented by these technologies. For example, certain non-volatile memory devices require a considerable amount of time to erase data. It is a common requirement within many non-volatile memory devices that data be erased on a block-by-block basis, and erasing an entire block of non-volatile memory cells takes a significant amount of time, thereby slowing overall memory system performance.

SUMMARY OF THE INVENTION

The present inventive concept provides non-volatile memory systems and related programming methods that improve performance by reducing the time required to perform an erase operation.

According to an aspect of the present inventive concept, there is provided a non-volatile memory cell array comprising; a defined data unit stored in a plurality of non-volatile memory cells capable of being electrically overwritten within the non-volatile memory cell array, and an erase marker corresponding to the data unit and indicating whether the data unit is in an erased state or a not-erased state. The data unit may be a page.

According to another aspect of the present inventive concept, there is provided a non-volatile memory device comprising; a non-volatile memory cell array divided into pages, each page including a plurality of non-volatile memory cells storing data and at least one non-volatile memory cell storing a corresponding erase marker indicating whether the plurality of non-volatile memory cells is in an erased state or a not-erased state, and a read-write circuit configured in response to a received read command indicating a target page among the plurality of pages to read and output data stored in the plurality of non-volatile memory cells of the target page when the erase marker indicates the not-erased state for the target page, and output erase default data when the erase marker indicates the not-erased state for the target page.

According to another aspect of the present inventive concept, there is provided a method of operating a non-volatile memory device comprising a non-volatile memory cell array divided into pages, each page including a plurality of non-volatile memory cells storing data and at least one non-volatile memory cell storing a corresponding erase marker indicating whether the plurality of non-volatile memory cells is in an erased state or a not-erased state, the method comprising; in response to a read command received by the non-volatile memory device indicating a target page among the plurality of pages, reading and outputting data stored in the plurality of non-volatile memory cells of the target page when the erase marker indicates the not-erased state for the target page, and otherwise, outputting erase default data when the erase marker indicates the not-erased state for the target page.

BRIEF DESCRIPTION OF THE DRAWINGS

The above and other aspects and features of the inventive concept will become more apparent upon consideration of certain exemplary embodiments thereof with reference to the attached drawings, in which.

DETAILED DESCRIPTION

Advantages and features of the present inventive concept and methods of accomplishing the same may be understood more readily by reference to the following detailed description of exemplary embodiments and the accompanying drawings. The inventive concept may, however, be embodied in many different forms and should not be construed as being limited to only the embodiments set forth herein. Rather, these embodiments are provided so that this disclosure will be thorough and complete and will fully convey the concept of the inventive concept to those skilled in the art. The scope of the inventive concept is defined by the appended claims.

Throughout the written description and drawings, like reference numbers and labels are used to indicate like or similar elements and/or steps. As used herein, the term "and/or" includes any and all combinations of one or more of the associated listed items.

Unless specially defined, all terms (including technical and scientific terms) used in the description could be used as meanings commonly understood by those ordinary skilled in the art to which the present inventive concept belongs. In addition, terms that are generally used but are not defined in the dictionary are not interpreted ideally or excessively unless they have been clearly and specially defined.

Hereinafter, a non-volatile memory device and a non-volatile memory cell array in accordance with certain embodiments of the inventive concept will be described with reference to FIGS. 1, 2 and 3.

Figure 1:
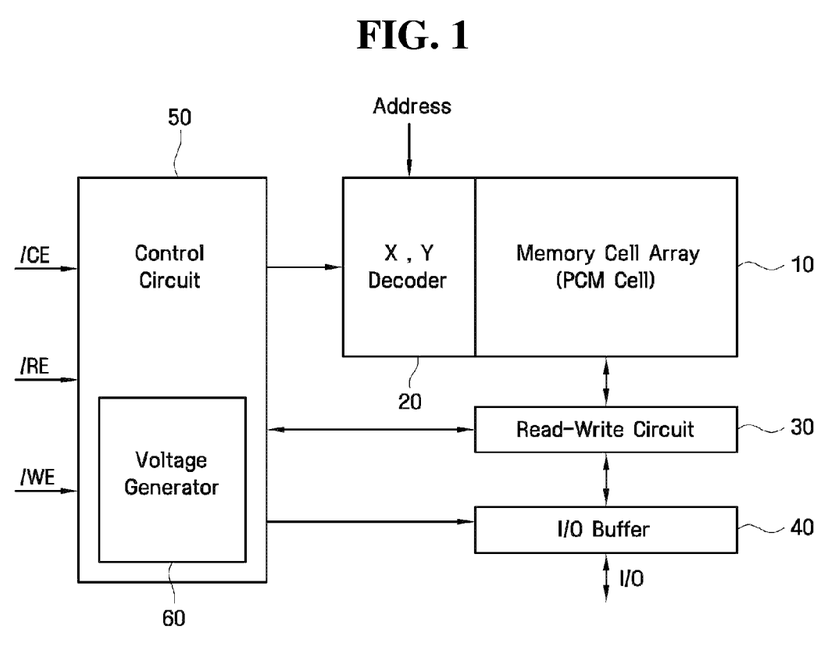
FIG. 1 is a block diagram illustrating a non-volatile memory device according to an embodiment of the inventive concept.

FIG. 1 is a block diagram schematically illustrating relevant portions of a non-volatile memory device according to an embodiment of the inventive concept. FIG. 2 is a conceptual block diagram further illustrating one possible non-volatile memory cell array within the non-volatile memory device of FIG. 1. FIG. 3 is a graph illustrating state definitions for a memory cell in a phase change random access memory (PRAM) according to an embodiment of the inventive concept. Certain PRAM and PRAM memory cell examples are presented herein as being exemplary of a much broader class of non-volatile memory devices.

Referring to FIG. 1, the illustrated non-volatile memory device comprises a memory cell array 10 that stores R-bit data, where R is a positive integer. As is understood by those skilled in the art, the memory cell array 10 will typically be formed as a matrix of non-volatile memory cells arranged among intersecting word and bit lines. The embodiments described herein assume the use of binary (1-bit) non-volatile memory cells, but those skilled in the art will understand that the inventive concept is applicable to non-volatile memory cell devices including an array of multi-bit memory cells.

The non-volatile memory cells contemplated by embodiments of the inventive concept may be freely overwritten. That is, the non-volatile memory cells are capable of storing newly written (or newly programmed) data even though they have previously been written to and current store data. Thus, it is not always necessary to erase the non-volatile memory cells before writing new data and yet maintain a high degree of data reliability.

It is assumed that the memory cell array 10 is arranged and operated as a NAND type memory cell array in which data is read from and written (or programmed) to the memory on a page basis. Thus, certain embodiments of the inventive concept may include a memory cell array like the one further illustrated in FIG. 2.

Figure 2:
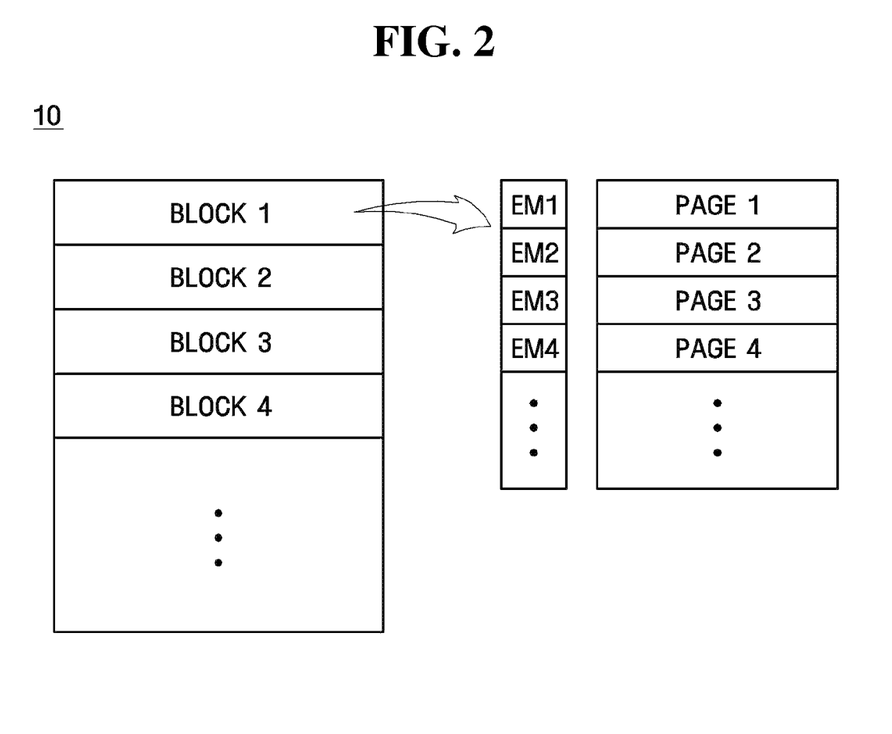
FIG. 2 is a conceptual block diagram further illustrating the non-volatile memory cell array of FIG. 1.

In FIG. 2, the memory cell array 10 is operationally divided into a plurality of blocks. Each block (e.g., Block 1 in FIG. 2) is then further divided into a plurality of pages. Since the memory cell array 10 is assumed to be a NAND type memory cell array data read from and written to the memory on a page basis. For example, further assuming that each page is 2 KB in size, the memory cell array 10 receives and stores externally provided "write data" 2 KB at a time, and similarly provides "read data" from memory 2 KB at a time.

Embodiments of the inventive concept are characterized in one aspect by an ability to provide an "erase marker" in relation to a particular set of data. The erase marked data may have any reasonable size, but many embodiments may use existing memory cell array definitions to guide the use of erase markers. For example, each designated page of non-volatile memory in FIG. 2 may be associated with an erase marker. In this context, the phrase "associated with an erase marker" refers to one or more processes whereby a defined set of data stored in a non-volatile memory is indicated as having been erased by reference to corresponding data entry (e.g., to a table, list or register) referred to as an erase marker (EM).

In certain embodiments of the inventive concept, designated non-volatile memory cells in a constituent memory cell array 10 may be used to store data indicating the state of erase markers. As such, the erase markers may be readily overwritten as needed using the same set of operations normally used to write/program data to the memory sell array generally. In certain embodiments of the inventive concept like the one illustrated in FIG. 2, the non-volatile memory cells designated to store erase markers may be included within (as part of) a corresponding page.

Each non-volatile memory cell (e.g., like the PRAM example illustrated in FIG. 3) used to store data corresponding to an erase marker may be programmed to either a first state (S1) indicating that the corresponding page (e.g., a first page PAGE1 in FIG. 2) has been erased, or a second state (S2) indicating that the corresponding page has not been erased. The first state S1 for the PRAM cell shown in FIG. 3 may be an amorphous state for the constituent phase change material and the second state S2 may be a crystalline state for same.

Figure 3:
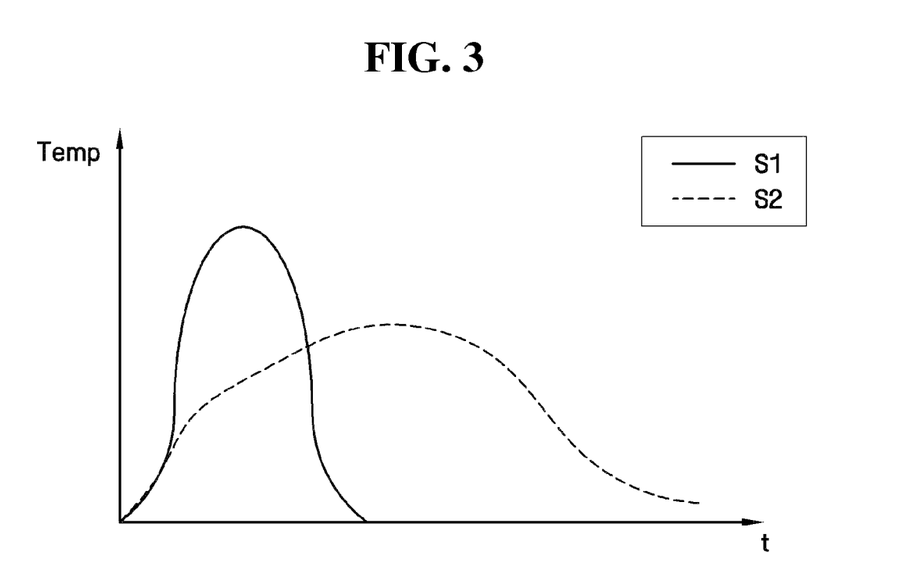
FIG. 3 is graph illustrating state definitions for a memory cell in a phase change random access memory (PRAM) according to an embodiment of the inventive concept.

As may be understood from FIG. 3 and a conventional familiarity with PRAM programming techniques, the foregoing definition of the erased state (S1) and the not-erased state (S2) is efficient, since the time required to change the PRAM cell to the amorphous state is less than the time required to change the state of the PRAM cell to the crystalline state. Accordingly, it is possible to improve efficiency of erase and read operations of the non-volatile memory device by defining the erase marker states as described above. A more detailed description thereof will be given below while explaining the operation of the non-volatile memory device in accordance with the embodiment of the inventive concept.

Referring again to FIG. 1, a decoder 20 select a row and a column of the memory cell array 10 corresponding to an externally provided address. Although the decoder 20 includes a row decoder (X-decoder) and a column decoder (Y-decoder) in FIG. 1, the inventive concept is not limited thereto. That is, the row decoder (X-decoder) and the column decoder (Y-decoder) may be provided separately from each other, as necessary.

A read-write circuit 30 under the control of a control circuit 50 essentially operates as a sense amplifier or a write driver in accordance with a current operation. Those skilled in the art will recognize that the read-write circuit 30 includes circuitry analogous or equivalent to a sense amplifier S/A and a page buffer, although the details of such are not shown in FIG. 1.

During a read operation, the read-write circuit 30 operates as a sense amplifier that reads data signals indicative of "read data" retrieved from the memory cell array 10 on a page basis. During a write/program operation, the read-write circuit 30 operates as a write driver in response to received "write data" and drives the row/column circuitry to store the write data to the memory cell array 10, also on a page basis. A page buffer or equivalent circuitry may be used in conjunction with the sense amplifier circuitry during these operations, as is conventionally understood.

However, during a read operation directed to (i.e., identified by a corresponding address) a "target page", the read-write circuit 30 will actually perform a full read operation in relation to the data stored in the target page only if the erase marker associated with the target page indicates a not-erased state (S2) for the target page. Otherwise, if the erase marker for the target page indicates the erased state (S1), the read-write circuit 30 does not perform a full read operation on the data stored in the target page, but instead returns a "erase default data" (e.g., "OxFFFF") for non-volatile memory cells of the target page. The actual data value defined for the erase default data will vary with data state definitions between different non-volatile memory systems. For example, if a data value of "1" is defined as an erased data state for the individual memory cells of a binary nonvolatile memory device, then the erase default data returned as read data from a target page having an erase marker indicating an erased state will all be "1". In this manner, a full read operation directed to the data actually stored in the non-volatile memory cells of a target page need not be performed. Rather, a page of erase default data may be quickly returned. This approach reduces the time required to perform the read operation and also allows pages designated for erasure to actually be erased during background processing period of the memory systems operation. That is, a page may be quickly designated as being "erased" by changing the corresponding erase marker during an ongoing sequence of read/write/erase operations without slowing down execution of the sequence conventionally caused by actually erasing all of the non-volatile memory cells in the page. Then, as needed or as desired, a marked "erased" page may be functionally erased or overwritten during less demanding period of time. Each of the foregoing results provides improved memory system performance.

An input/output buffer (I/O buffer) 40 receives the externally provide write data during a write/program operation and loads it to the read-write circuit 30, and alternately receives read data from the read-write circuit 30 during a read operation.

The control circuit 50 generally provides conventionally understood control signals like a chip enable signal (/CE), a read enable signal (/RE), a write enable signal (/WE) and the like, and directly or indirectly controls the decoder 20, read-write circuit 30 and I/O buffer 40 during read/write/erase operations directed to the memory cell array 10. The control circuit 50 may include one or more voltage generator(s) 60 as shown in FIG. 1. The voltage generator 60 under control of the control circuit 50 generates one or more voltages applied to the rows and columns of the memory cell array 10 according to various operation modes. Those skilled in the art understand the definition, generation and use of these voltages and corresponding control signals.

Exemplary operation of the non-volatile memory device in accordance with an embodiment of the inventive concept will now be described with reference to FIGS. 1, 2, 4, 5 and 6.

Figure 4:
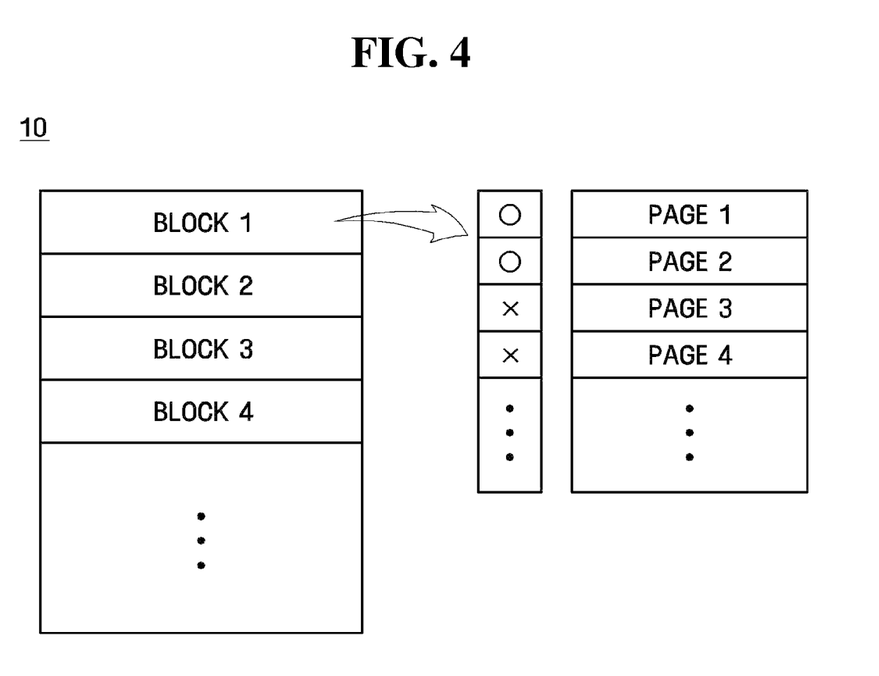
FIG. 4 is a conceptual block diagram further illustrating an erase operation for a non-volatile memory device according to an embodiment of the inventive concept.
Figure 5:
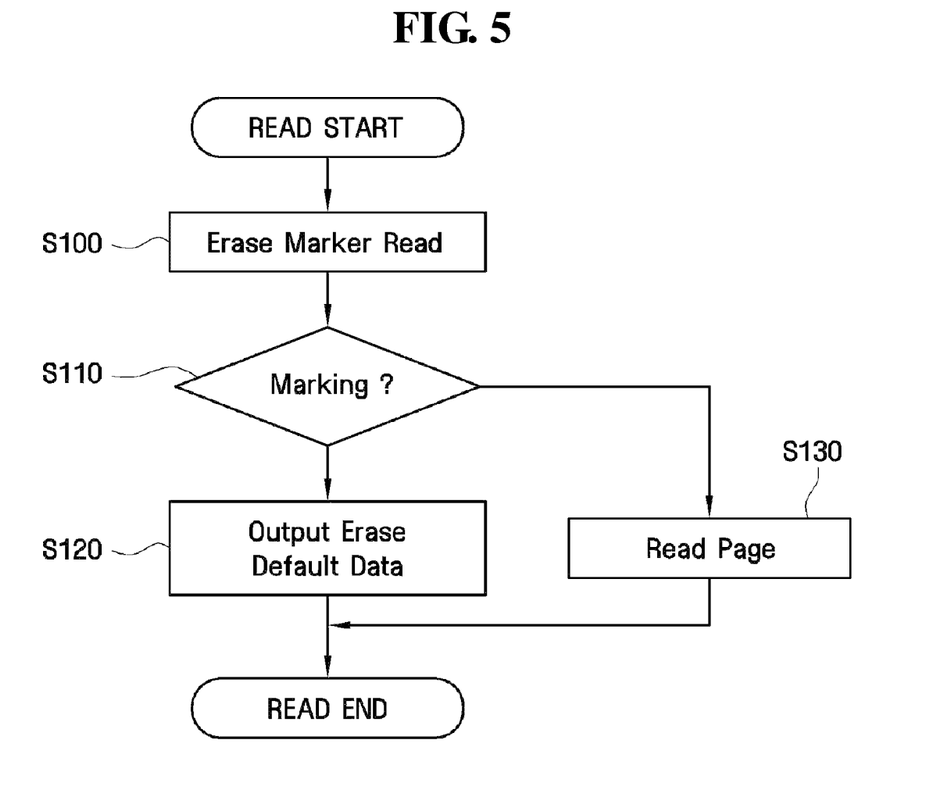
FIG. 5 is a flowchart summarizing a read operation performed in a non-volatile memory device according to an embodiment of the inventive concept.
Figure 6:
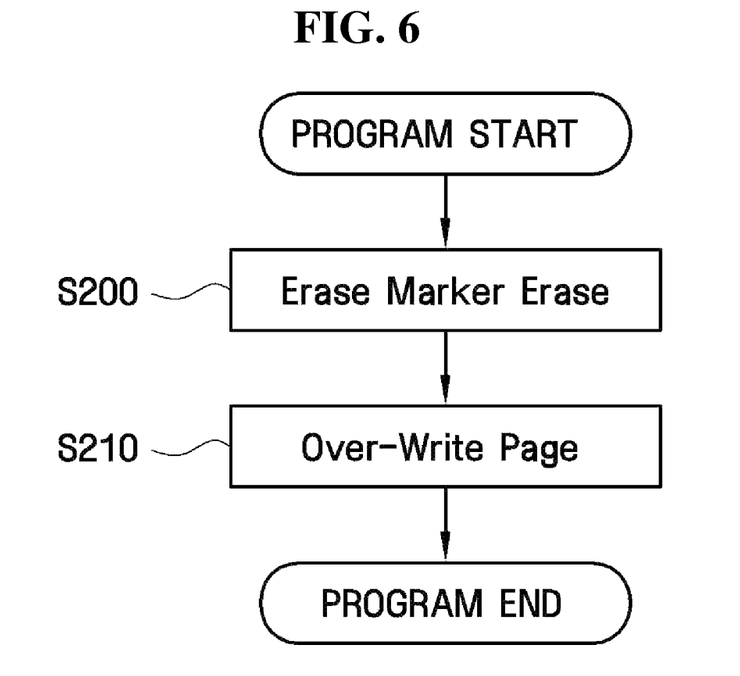
FIG. 6 is a flowchart summarizing a write operation performed in a non-volatile memory device according to an embodiment of the inventive concept.

FIG. 4 is a conceptual block diagram illustrating an assumed set of conditions in the memory cell array 10 of a non-volatile memory device in accordance with an embodiment of the inventive concept. FIG. 5 is a flowchart summarizing, in relevant part, a read operation executed in the non-volatile memory device in accordance with the embodiment of the inventive concept. FIG. 6 is a flowchart summarizing, in relevant part, a write operation executed in the non-volatile memory device in accordance with the embodiment of the inventive concept.

Referring to FIGS. 1, 2 and 4, it is assumed that one or more commands have been received and executed resulting in the "erasure" of pages 3 and 4 of the memory cell array 10. In response to these operations, the data actually stored in the non-volatile memory cells associated with pages 3 and 4 need not necessarily be erased (i.e., overwritten or changed), except for the one or more non-volatile memory cells respectively storing the erase makers for pages 3 and 4. These erase markers are updated and changed from not-erased to erased ("O"→"X"). In contrast, the erase markers associated with pages 1 and 2 indicate not-erased. Merely, updating the erase markers associated with pages 3 and 4 can be performed much more quickly than actually erasing the data stored in each and every non-volatile memory cell of pages 3 and 4. Hence, erase operation speed is enhanced and associated current consumption efficiency is improved.

It should be noted that mobile host devices incorporating a non-volatile memory device according to an embodiment of the inventive concept may delay "full" execution of the erase operation (i.e., actually erasing the individual non-volatile memory cells) until a time when power conditions and/or operating conditions better warrant such execution. For example, a low battery condition for the host device may preclude the current consumption required to execute the full erase operation. Later, (e.g., during a battery recharging period or a high battery condition) "marked as erased" pages in the non-volatile memory may be subjected to the full erase operation. Alternately or additionally, marked as erased pages in the non-volatile memory may be subjected to the full erase operation during down periods or background operating conditions for the host device.

Referring to FIGS. 1 and 5, upon receiving a "read command" (i.e., one or more control signals and/or associated control/address data) directed to a target page (e.g., Page 1 of FIG. 2), the non-volatile memory device, through operation of the control circuit 50, decoder 20, and read/write circuit 30, will first read the erase maker (e.g., EM1 of FIG. 2) associated with the target page (S100). If the erase marker for the target page is marked as erased (S110=Yes) the target page is not actually read, but defined erase default data (e.g., "OxFFFF") is output (S120) by the read-write circuit 30. Otherwise, if the erase marker for the target page is not marked as erased (S110=No), the target page may be conventionally read (S130) and the resulting read data output through read-write circuit 30.

Referring now to FIGS. 1 and 6, if an externally provided write/program command (including a corresponding write Address) is received by the non-volatile memory device directed to a target page, the control circuit 50, read-write circuit 30, and decoder 20 operate to execute the write/program operation. In so doing, the read-write circuit 30 updates (i.e., "X"→"O" using the nomenclature of FIG. 4) the erase marker corresponding to the target page (S200), and then may conventionally overwrite the data stored in the non-volatile memory cells of the target page (S210). The process of overwriting the non-volatile memory cells of the target page may involve express erase followed by write steps, or a direct write step.

Since write/program operations for the non-volatile memory device in accordance with embodiments of the inventive concept are performed on a page basis as described above, although write data having a size smaller than page size is to be written to the target page, such a requirement will not adversely affect data reliability. For example, assuming a defined page size of 2 KB, if only 1 KB of write data is to be written to the target page, then 1 KB of actual write data and 1 KB of write default data (e.g., "OxFFFF") may be written to the target page, thereby ensuring data reliability.

As noted briefly above, a non-volatile memory device in accordance with an embodiment of the inventive concept may be a PRAM and the efficiency of the erase and write operations for this type of non-volatile memory device may be further enhanced by using the amorphous state of the PRAM cells storing the erase marker to indicate the erased state and using the crystalline state to indicate the not-erased state.

When in response to a received command indicating that a target page is to be "erased", and consistent with an embodiment of the inventive concept the command results only in an update of non-volatile memory cells storing an erase marker for the target page, even this modest updating of the erase maker may be most efficiently accomplished, since the time required to change the state of the PRAM cell to the amorphous state is less than the time required to change the state of the PRAM cell to the crystalline state. Accordingly, it is advantageous to define the amorphous state of the PRAM cell storing the erase marker as the state (e.g., S1 of FIG. 3 and X of FIG. 4).

On the other hand, when a received command (e.g., a write/program command) is received, the erase marker EM is updated and write data is actually written to the target page. In this case, it takes a predetermined period of time to actually write the data to the target page. Accordingly, there is relatively more time for updating the erase marker during the write operation than during the erase operation. Accordingly, it is advantageous to define the crystalline state of the PRAM cell forming the erase marker as the not-erased state (e.g., S2 of FIGS. 3 and O of FIG. 4).

Each of the foregoing embodiments allows improved efficiency in the erasure and reading of data stored by a non-volatile memory device.

Figure 7:
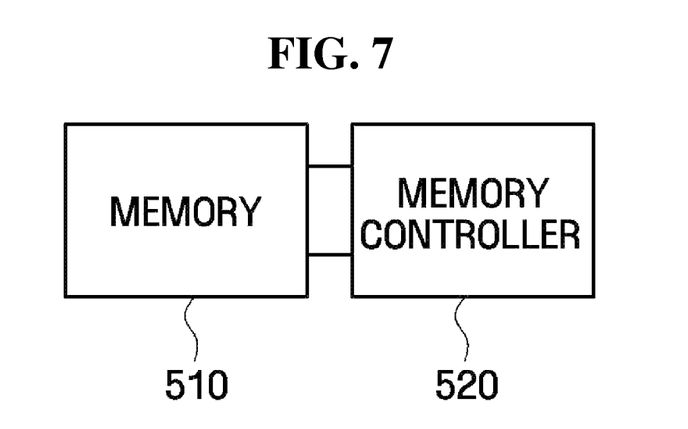
FIGS. 7, 8 and 9 are general bock diagrams illustrating systems incorporating a non-volatile memory device according to an embodiment of the inventive concept.
Figure 8:
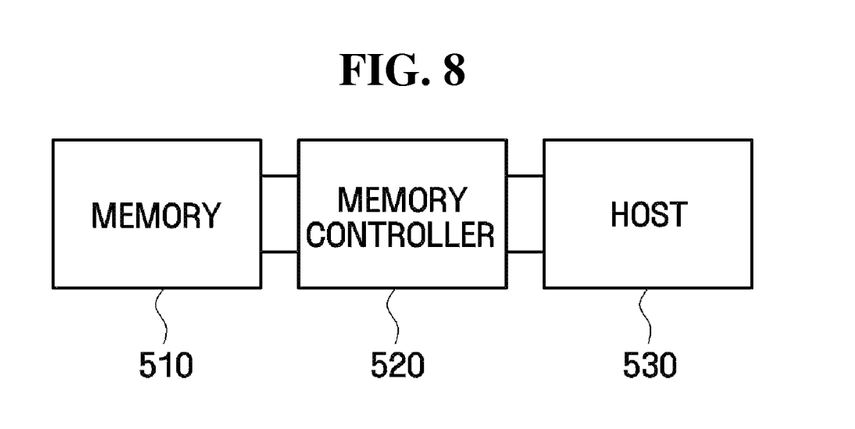
Figure 9:
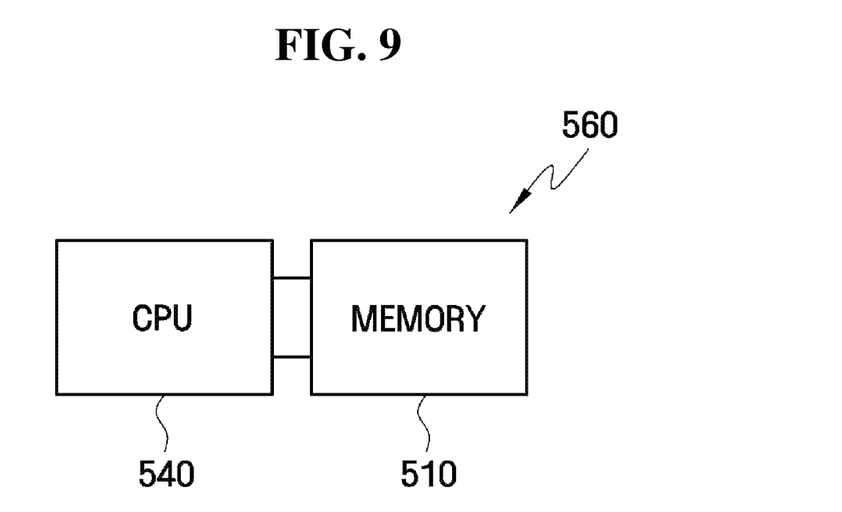

FIGS. 7, 8 and 9 are general block diagrams illustrating certain application examples incorporating a non-volatile memory device in accordance with an embodiment of the inventive concept.

Referring to FIG. 7, a system comprises a memory device 510 and a memory controller 520 connected to the memory device 510. In this case, the memory device 510 may be a non-volatile memory device fabricated in accordance with the aforementioned embodiment of the present inventive concept, which is a memory device capable of improving performance by reducing the erase operation time, as described above. The memory controller 520 may provide an input signal for controlling an operation of the memory device 510, e.g., a command signal and an address signal for controlling a read operation and a write operation, to the memory device 510.

The system including the memory device 510 and the memory controller 520 may be embodied in a card such as a memory card. Specifically, the system in accordance with the embodiment of the present inventive concept may be embodied in a card which satisfies a specified industry standard and is used in an electronic device such as a mobile phone, a two-way communication system, a one-way pager, a two-way pager, a personal communication system, a portable computer, a personal data assistant (PDA), an audio and/or video player, a digital and/or video camera, a navigation system, a global positioning system (GPS), and the like. However, it is not limited thereto, and the system in accordance with the embodiment of the present inventive concept may be embodied in various forms such as a memory stick.

Referring to FIG. 8, another system comprises a memory device 510, a memory controller 520, and a host system 530. In this case, the host system 530 may be connected to the memory controller 520 via a bus and the like, and provide a control signal to the memory controller 520, so that the memory controller 520 can control an operation of the memory device 510. The host system 530 may be, for example, a processing system used in a mobile phone, a two-way radio communication system, a one-way pager, a two-way pager, a personal communication system, a portable computer, a PDA, an audio and/or video player, a digital and/or video camera, a navigation system, a GPS, and the like.

Meanwhile, although the memory controller 520 is interposed between the memory device 510 and the host system 530 in FIG. 8, it is not limited thereto, and the memory controller 520 may be selectively omitted in a system in accordance with still another embodiment of the present inventive concept.

Referring to FIG. 9, a computer system 560 generally comprises a central processing unit (CPU) 540 and a memory device 510. In the computer system 560, the memory device 510 may be connected to the CPU 540 directly or using a typical computer bus architecture. The memory device 510 may store an operation system (OS) instruction set, a basic input/output start up (BIOS) instruction set, an advanced configuration and power interface (ACPI) instruction set and the like, or may be used as a large-capacity storage device such as a solid state disk (SSD).

For convenience of explanation, all constituent elements included in the computer system 560 are not illustrated in FIG. 9, but it is not limited thereto. Further, for convenience of explanation, the memory controller 520 is omitted between the memory device 510 and the CPU 540 in FIG. 9. However, the memory controller 520 may be interposed between the memory device 510 and the CPU 540 in still another embodiment of the present inventive concept.

While the present inventive concept has been particularly shown and described with reference to exemplary embodiments thereof, it will be understood by those of ordinary skill in the art that various changes in form and detail may be made therein without departing from the scope of the inventive concept as defined by the following claims. The exemplary embodiments should be considered in a descriptive sense only and not for purposes of limitation.

What is claimed is:

1. A non-volatile memory cell array comprising:
   a defined data unit stored in a plurality of non-volatile memory cells capable of being electrically overwritten within the non-volatile memory cell array;
   an erase marker corresponding to the data unit and indicating whether the data unit is in an erased state or a not-erased state; and
   a read-write circuit configured, in response to a read request, to generate default read data when the erase marker indicates that the data unit is in the erased state, and to read the data unit from the plurality of memory cells when the erase marker indicates that the data unit is in the not-erased state.

2. The non-volatile memory cell array of claim 1, wherein the data unit is a page.

3. The non-volatile memory cell array of claim 2, wherein each one of the plurality of non-volatile memory cells is a phase change random access memory (PRAM) cell.

4. The non-volatile memory cell array of claim 3, wherein the erase marker is one or more PRAM cells in the page.

5. The non-volatile memory cell array of claim 4, wherein the erase state is indicated when a phase-change material of the one or more PRAM cells is in an amorphous state, and the not-erased state is indicated when the phase-change material of the one or more PRAM cells is in a crystalline state.

6. The non-volatile memory cell array of claim 1, wherein the memory cell array is a NAND type memory cell array in which data are read from and written/programmed to the memory cell array on a page basis.

7. The non-volatile memory cell array of claim 1, wherein at least one of the plurality the non-volatile memory cells is a single level memory cell.

8. A non-volatile memory device comprising:
a non-volatile memory cell array divided into pages, each page including a plurality of non-volatile memory cells storing data and at least one non-volatile memory cell storing a corresponding erase marker indicating whether the plurality of non-volatile memory cells is in an erased state or a not-erased state; and
a read-write circuit configured in response to a received read command indicating a target page among the plurality of pages to read and output data stored in the plurality of non-volatile memory cells of the target page when the erase marker indicates the not-erased state for the target page, and output erase default data when the erase marker indicates the not-erased state for the target page.

9. The non-volatile memory device of claim 8, wherein the plurality of the non-volatile memory cells are each a phase change random access memory (PRAM) cell.

10. The non-volatile memory device of claim 9, wherein the at least one non-volatile memory cell storing an erase marker is a PRAM cell.

11. The non-volatile memory device of claim 10, wherein the erase state is indicated when a phase-change material of the at least one PRAM cell is in an amorphous state, and the not-erased state is indicated when the phase-change material of the at least one PRAM cell is in a crystalline state.

12. The non-volatile memory device of claim 8, wherein the memory cell array is a NAND type memory cell array in which data are read from and written/programmed to the memory cell array on a page basis.

13. The non-volatile memory device of claim 8, wherein at least one of the plurality the non-volatile memory cells is a single level memory cell.

14. The non-volatile memory device of claim 8, wherein the read-write circuit is further configured in response to a received write command indicating a target page among the plurality of pages and including write data to write the write data to the plurality of non-volatile memory cells of the target page and update the erase marker for the target page.

15. The non-volatile memory device of claim 14, wherein the write data is less than a page.

16. A method of operating a non-volatile memory device comprising a non-volatile memory cell array divided into pages, each page including a plurality of non-volatile memory cells storing data and at least one non-volatile memory cell storing a corresponding erase marker indicating whether the plurality of non-volatile memory cells is in an erased state or a not-erased state, the method comprising:
in response to a read command received by the non-volatile memory device indicating a target page among the plurality of pages, reading and outputting data stored in the plurality of non-volatile memory cells of the target page when the erase marker indicates the not-erased state for the target page; and otherwise,
outputting erase default data when the erase marker indicates the not-erased state for the target page.

17. The method of claim 16 further comprising:
in response to a write/program command received by the non-volatile memory device indicating a target page among the plurality of pages and including write data, writing the write data to the plurality of non-volatile memory cells of the target page; and
updating the erase marker for the target page.

18. The method of claim 17, wherein the write data is less than a page.

19. The method of claim 17, wherein the plurality of the non-volatile memory cells are each a phase change random access memory (PRAM) cell, the at least one non-volatile memory cell storing an erase marker is a PRAM cell, the erase state is indicated when a phase-change material of the at least one PRAM cell is in an amorphous state, and the not-erased state is indicated when the phase-change material of the at least one PRAM cell is in a crystalline state.

* * * * *